United States Patent [19]
Fu

[11] Patent Number: 6,042,706
[45] Date of Patent: *Mar. 28, 2000

[54] IONIZED PVD SOURCE TO PRODUCE UNIFORM LOW-PARTICLE DEPOSITION

[75] Inventor: Jianming Fu, San Jose, Calif.

[73] Assignee: Applied Materials, Inc., Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/782,184

[22] Filed: Jan. 14, 1997

[51] Int. Cl.⁷ .................................................. C23C 14/34
[52] U.S. Cl. ............................... 204/298.12; 204/298.06; 204/298.19; 204/298.2; 204/298.17; 204/298.18
[58] Field of Search ........................ 204/298.12, 298.15, 204/298.17, 298.18, 298.19, 298.2, 298.06

[56] References Cited

U.S. PATENT DOCUMENTS

| | | | |
|---|---|---|---|
| 3,654,110 | 4/1972 | Kraus ................................. | 204/192.12 |
| 3,669,871 | 6/1972 | Elmgren et al. ................... | 204/192.12 |
| 3,988,232 | 10/1976 | Wasa et al. ........................ | 204/192.18 |
| 4,100,055 | 7/1978 | Rainey ............................... | 204/298.18 |
| 4,394,236 | 7/1983 | Robinson ........................... | 204/192.12 |
| 4,457,825 | 7/1984 | Lamont, Jr. ........................ | 204/298.12 |
| 4,547,279 | 10/1985 | Kiyota et al. ...................... | 204/192.12 |
| 4,622,121 | 11/1986 | Wegmann et al. .................. | 204/298.2 |
| 4,668,338 | 5/1987 | Maydan et al. ..................... | 156/643.1 |
| 4,673,480 | 6/1987 | Lamont, Jr. ........................ | 204/298.18 |
| 4,721,553 | 1/1988 | Saito et al. ......................... | 204/192.12 |
| 4,747,926 | 5/1988 | Shimizu et al. .................... | 204/298.12 |
| 4,756,810 | 7/1988 | Lamont, Jr. et al. ................ | 204/192.3 |
| 4,957,605 | 9/1990 | Hurwitt et al. ..................... | 204/192.12 |
| 5,174,880 | 12/1992 | Bourez et al. ...................... | 204/298.17 |
| 5,194,131 | 3/1993 | Anderson ........................... | 204/192.12 |
| 5,242,566 | 9/1993 | Parker ................................ | 204/298.2 |
| 5,320,728 | 6/1994 | Tepman .............................. | 204/192.12 |
| 5,366,607 | 11/1994 | Lal et al. ............................ | 204/298.19 |
| 5,556,525 | 9/1996 | Krivokapic et al. ................ | 204/298.17 |
| 5,753,090 | 5/1998 | Obinata .............................. | 204/298.12 |

FOREIGN PATENT DOCUMENTS

| | | |
|---|---|---|
| 0 273 550 | 10/1997 | European Pat. Off. . |
| 150 482 | 9/1981 | Germany . |
| 61-190070 | 8/1986 | Japan ................................ 204/298.16 |
| 62-017175 | 1/1987 | Japan . |
| 63-243272 | 3/1987 | Japan . |
| 2-118068 | 5/1990 | Japan ................................ 204/298.12 |
| 5-148633 | 6/1993 | Japan . |
| 7-166346 | 6/1995 | Japan . |

*Primary Examiner*—Nam Nguyen
*Assistant Examiner*—Rodney G. McDonald
*Attorney, Agent, or Firm*—Thomason Moser & Patterson

[57] ABSTRACT

The present invention generally provides a target structure that allows uniform erosion and efficient utilization of a sputterable material while reducing particle generation caused by backscatter deposition. The target has an annular region comprised of sputterable material and a central region configured to receive direct deposition rather than backscatter deposition. The annular region of the target provides an exposed surface that is generally concave, but is preferably substantially frustoconical. The central region of the target provides an exposed surface having a configuration that is either substantially planar or convex, but is preferably substantially convex frustoconical.

38 Claims, 3 Drawing Sheets

IONIZED PVD SOURCE TO PRODUCE UNIFORM LOW-PARTICLE DEPOSITION

BACKGROUND OF THE INVENTION

1. Field of the Invention

This invention relates generally to physical vapor deposition (PVD) of thin films of materials from a target source onto a workpiece or substrate such as in the manufacture of integrated electronic circuits. More particularly, the invention relates to methods for improving the uniformity of target erosion and efficient utilization of target material in PVD processes, while reducing redeposition of particles on the target.

2. Background of the Related Art

Physical vapor deposition (PVD) or sputtering is a known technique used in the manufacture of integrated circuits. In PVD, a target of a desired coating material is bombarded by ions accelerated thereto to dislodge and eject target material from the target which is then deposited onto a substrate. The target and the substrate to be coated are generally placed in a vacuum chamber which is evacuated to and maintained at a pressure of less than about 10 milliTorr. Typically, a heavy inert gas such as argon is supplied to the vacuum chamber and a pumping system maintains the desired gas pressure in the chamber. A glow discharge plasma is created in the low pressure argon, at least partially ionizing the gas, by supplying a high negative DC, AC or RF potential to a cathode (typically the target) and grounding the chamber walls and an anode (typically the substrate). The glow discharge plasma is created in the space between the cathode and the anode, and is generally separated from the electrodes by a dark space or plasma sheath. Since the plasma itself is a good conductor, the plasma remains at essentially a constant positive potential with respect to the negatively biased cathode. This produces an electric field at the target that is substantially perpendicular to the exposed surface of the target. Thus, positive ions from the plasma are accelerated across the dark space onto the exposed surface of the target following trajectories substantially perpendicular to the exposed front surface of the target resulting in sputtering of the target.

In planar magnetron sputtering, the density of ion bombardment at the target surface is enhanced by producing a magnetic field in the plasma sheath adjacent the target that helps trap and deflect electrons near the target. Permanent magnets or electromagnets are located behind the target, or on the backing plate onto which the target is mounted, to produce a magnetic field parallel to the surface of the target. Plasma electrons spiral along these magnetic field lines and increase the electron density in these regions. The increased electron density contributes to additional gas ionization in these regions which leads to increased target bombardment and sputtering of the target between the poles of the magnets creating a pattern of target erosion.

Typically, a racetrack pattern is formed in the target between the poles of the magnets where the target erodes more rapidly. Physically rotating an off-axis magnet arrangement on the backing of the target may be used to control and alter the pattern of target erosion. The other areas of the target are eroded more slowly, and may not be eroded at all, thereby allowing redeposition or back sputtering of particles onto the target. Backsputtered particles tend to loosely adhere to the target surface on which they are deposited and tend to flake off over time. In addition, nonuniform erosion leaves a substantial portion of the target unused even when the areas between the poles have been completely eroded.

It is important that replacement of the target occur before the target is eroded down to the backing plate on which the target is attached. Particles sputtered from the backing plate material which reach the workpiece would seriously contaminate or destroy the workpiece. Consequently, a target is typically replaced before the target has been fully utilized leaving expensive target material unused. Since expensive target materials would thereby be wasted, it would be desirable if other means to assure uniform target erosion across the surface could be employed.

U.S. Pat. Nos. 5,320,728 and 5,242,566, which are assigned to the assignee of the present invention, teach the design of magnetron arrays to enhance target erosion uniformity. Other techniques such as the use of masks or blocking media placed over the target have been used to prevent redeposition of material onto the target. All magnetron targets, however, generally have areas of re-deposition on the target surface caused by target material becoming ionized either during or after sputtering and being deposited onto the target surface between the sputtering grooves formed by the high negative potential applied thereto. Masking surfaces do not prevent deposition of backsputtered particles on the masking surface and are not well suited to receive sputtered target material. Accordingly, when backsputtered material is deposited on the target or mask, the material tends to loosely adhere to the surface and can flake off and contaminate the chamber.

Therefore, there remains a need for a target source and sputtering system which enables efficient use of target material and which reduces the likelihood that back sputtered material will deposit on the target and become a particle source.

SUMMARY OF THE INVENTION

The present invention provides a target for a physical vapor deposition system. The target comprises an annular region comprising a sputterable material and a central region disposed within the annular region. The annular region is made of a sputterable material and has an exposed surface that is concave and preferably substantially frustoconical. The central region is preferably comprised of aluminum or the same sputterable material as the annular region. The central region is provided with an exposed surface that is substantially planar or convex, most preferably substantially frustoconical, to receive deposition material or backsputtered material thereon.

The invention also provides a sputter chamber comprising an enclosure, a workpiece support member disposed in the enclosure to form an anode, and a sputter target having an exposed surface facing the workpiece support member within the enclosure to form a cathode. The exposed surface of the sputter target is provided with a central region and a concave annular region, as described above.

BRIEF DESCRIPTION OF THE DRAWINGS

In order to provide a more detailed understanding of the manner in which the above recited features, advantages and objects of the present invention are attained, a more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The present invention generally provides a target structure that allows uniform erosion and efficient utilization of a sputterable material, while reducing particle generation caused by backscatter deposition. The target has an annular region comprised of sputterable material and a central region configured to receive direct deposition and backscatter deposition. The annular region of the target provides an exposed surface that is generally concave, but is preferably substantially frustoconical. The central region of the target is configured so that any material deposited thereon firmly adheres to the surface. Preferably, the central region provides an exposed surface having a configuration that is either substantially planar or convex, but is most preferably substantially frustoconical.

In one aspect of the invention, the annular and central regions are both sputterable material, preferably a single sputterable member. Sputtering of the annular region, preferably enhanced by a magnetron assembly, provides a wide distribution of particle trajectories, but results in the deposition of a uniform film onto a workpiece. The central region is generally not sputtered and has a planar or convex surface configured to receive direct deposition of particles from the annular region, rather than backscatter deposition.

In another aspect of the invention, the annular region is formed of a sputterable material and the central region is a grounded member, preferably made of aluminum or stainless steel. The central region has a planar or convex surface configured to receive direct deposition of particles from the annular region, rather than backscatter deposition. In one embodiment, the central region is provided by a backing plate.

The sputtering apparatus of the present invention generally contemplates the positioning of a sputter target in a vacuum chamber, then sputtering material from an exposed sputtering surface of the target and depositing a portion of that material on a workpiece. The sputtering surface of the target is disposed at least partially obliquely, or non-parallel, to the uppermost surface of the workpiece. This oblique sputtering surface is positioned to provide a high density of target material traveling in trajectories which are perpendicular to the workpiece without the necessity of a physical collimation device. The deposition layer formed on the workpiece, and on the base and wall regions of the holes in the uppermost surface thereof, will be relatively uniform and continuous over the workpiece field and within each feature formed in the uppermost surface of the workpiece. Furthermore, the thickness of the film layer formed on the base and wall of the feature will be substantially equal in each of the features in the uppermost surface of the workpiece.

Figure 1:
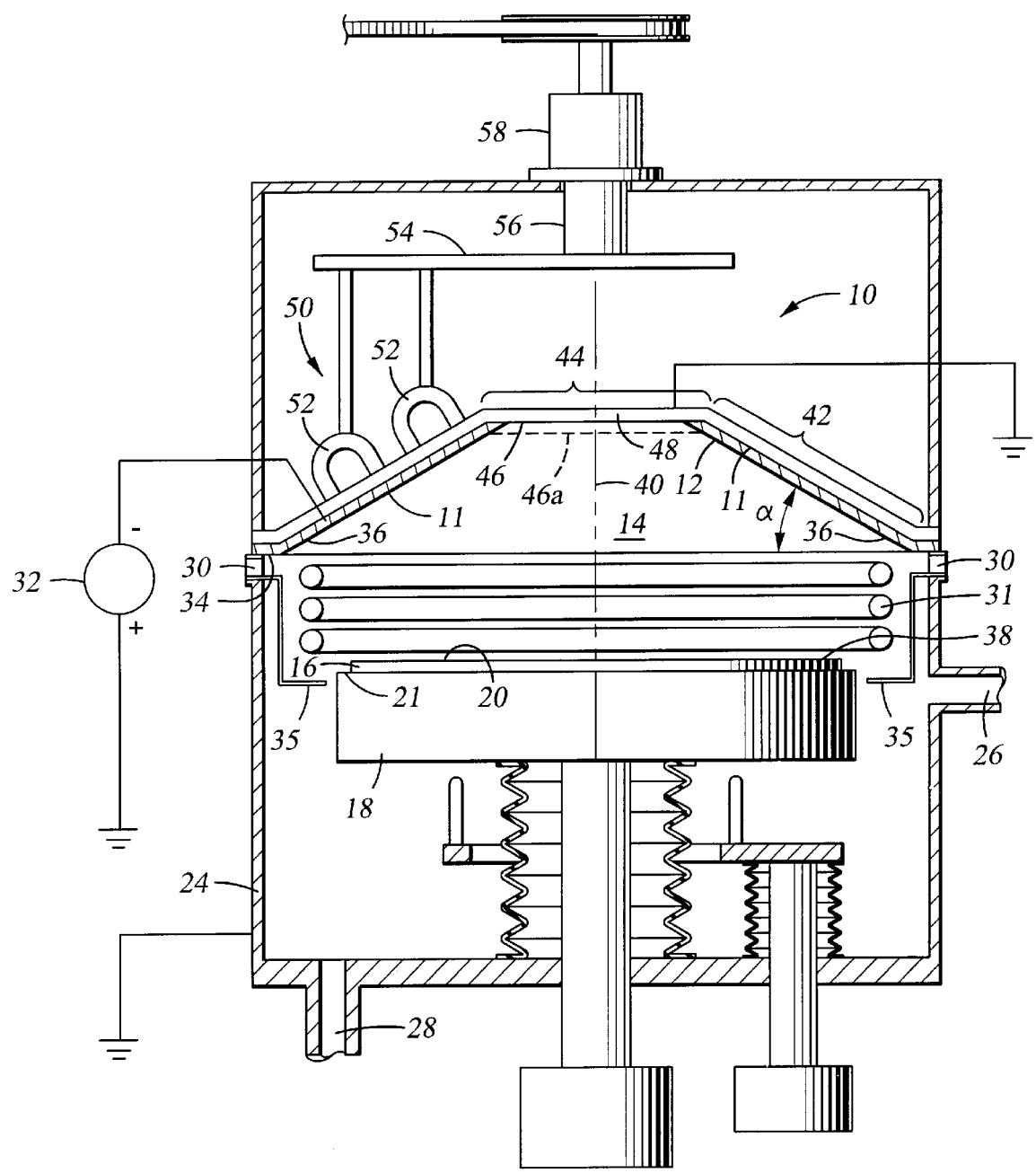
FIG. 1 is a cross-sectional view of a sputtering apparatus having a target structure in accordance with the present invention.

FIG. 1 is a cross-sectional view of a sputtering apparatus having a sputtering target of the present invention disposed therein. The target 10 provides an oblique sputtering surface 12 positioned in a conventional vacuum chamber 14, wherein a workpiece 16 is received in the chamber 14 and positioned on a support member, such as a pedestal 18, for depositing a layer of sputtered material on the top surface 20 of the workpiece 16. The pedestal 18 includes a generally planar surface 22 for receiving the workpiece 16 thereon, so that the top surface 20 of the workpiece 16 is generally parallel to the planar surface 21 of the pedestal 18. The material layer may, if desired, be formed over one or more dielectric, metal or other layers previously formed on the workpiece 16, and may fill holes in the dielectric or other layer to form a via, line or contact.

The conventional vacuum chamber 14 generally includes a chamber enclosure wall 24, having at least one gas inlet 26 and an exhaust outlet 28 connected to an exhaust pump (not shown). The workpiece support pedestal 18 is typically disposed through the lower end of the chamber 14, and the target 10 is typically received at the upper end of the chamber 14. The target 10 is electrically isolated from the enclosure wall 24 by an insulating member 30 and the enclosure wall 24 is preferably grounded, so that a negative voltage may be maintained on the target 10 with respect to the grounded enclosure wall 24. It is preferred that the chamber 14 further include an inductive coil 31 coupled to a power supply (not shown) to provide an inductively coupled plasma. Alternatively, the target of the present invention may be used in a chamber having a shield suspended within the chamber, including an annular, upturned, wall on which a clamp ring (or perhaps a collimator) may is suspended over the pedestal when the pedestal is retracted downwardly in the chamber.

Before material layer can be sputtered onto the workpiece 16, the workpiece 16 is typically passed through a load lock (not shown) communicating with a slit valve (not shown) in the enclosure wall 24, and positioned within the chamber 14 by a robot arm, blade or other workpiece handling device (not shown) to be received on the support pedestal. In preparation for receiving a workpiece, the substrate support pedestal is lowered by a drive mechanism well below the clamp ring suspended on the shield so that the bottom of the pedestal is close to a pin positioning platform. The pedestal typically includes three or more vertical bores (not shown), each of which allows a vertically slidable pin to pass therethrough. When the pedestal is in the lowered position just described, the upper tip of each pin protrudes above the upper surface of the pedestal. The upper tips of the pins define a plane parallel to the upper surface of the pedestal.

A conventional robot arm typically carries the substrate into the chamber and places the substrate above the upper tips of the pins. A lift mechanism moves the pin platform upwardly, to place the upper tips of the pins against the underside of the substrate and additionally lift the substrate off the robot blade (not shown). The robot blade then retracts from the chamber, and the lift mechanism raises the pedestal above the tips of the pins, thereby placing the substrate onto the top surface of the pedestal.

The lift mechanism continues to raise the pedestal until the substrate is an appropriate distance from the target so that the film deposition process can begin. When an annular clamp ring is used, the substrate contacts the inner portion of the annular clamp ring resting on the upturned wall portion. The inner diameter of the clamp ring is slightly smaller than the diameter of the substrate.

Sputter deposition processes are typically performed in a gas such as Argon that is charged into the vacuum chamber 14 through the gas inlet 26 at a selected flow rate regulated by a mass flow controller. A power supply 32 applies a negative voltage to the target 10 with respect to the enclosure wall 24 so as to excite the gas into a plasma state. Ions from the plasma bombard the target surface 12 and sputter atoms and other particles of target material from the target 14. The power supply 32 used for biasing purposes may be any type of power supply as desired, including DC, pulsed DC, AC, RF and combinations thereof.

The target 10 of the present invention is configured with a sputterable member 11 having a generally concave sputtering surface 12, which terminates inwardly of the chamber wall 24 in a generally circular face 34. The face 34 has minimal surface area, but is necessary to avoid having a point at the inner end of the target. The face 34 is spaced from the workpiece 16 by a distance sufficient to prevent arcing between the high voltage sputtering surface 12 of the target 10 and the grounded workpiece support member 18. It is preferred that the space between the face 34 and the workpiece 16 be sufficient to ensure that particles sputtered from the target surface 12 near the face, which are traveling substantially transverse to the workpiece 16, do not deposit on the workpiece 16, but instead pass over the workpiece 16 and deposit on the chamber walls 24 or on chamber shields 35. Furthermore, the outer edge 36 of the sputtering surface 12 extends a short distance radially outward beyond the edge 38 of the workpiece 16 received on the support member 18.

The target 10 of the present invention defines an annular region 42 disposed substantially symmetrically about a reference line 40 that is perpendicular to the workpiece 16 and passes through the approximate center of the workpiece 16. The annular region 42 comprises the sputtering surface 12 that provides deposition of a film onto the workpiece 16 that is more uniform than typical films sputtered from circular targets. The preferred annular sputtering surface 12 is a frustoconical surface, most preferably forming an angle α from parallel to the workpiece surface 20 to sputter particles having trajectories that are perpendicular to the workpiece surface 20. The relationship between the angle and the workpiece is described in more detail below with reference to FIG. 3.

The target 10 also defines a central region 44 disposed substantially symmetrically about the reference line 40. The central region 44 comprises an exposed surface 46, 46a that serves to receive direct deposition of particles sputtered from the annular region that have transverse trajectories. The exposed surface 46 may be provided by a grounded member, possibly forming a portion of the backing plate 48. Alternatively, an exposed surface 46a may be provided by a sputterable member 11 that extends over the central region 44. Although the surface 46a is potentially sputterable, it is preferred to limit the ionizing enhancing effect of a mangetron 50 to the annular region 42.

The target 10 produces less particulate contaminants than typical targets, because the central region 44 provides a surface 46, 46a that is disposed to receive direct deposition of sputtered particles. Direct deposition is less likely to flake or fall off a surface than is backscatter deposition which is formed when scattered particles come into contact with a surface. Furthermore, the surface 46, 46a in the central region is preferably not sputtered in order to avoid disturbing the deposits formed thereon.

The throughput of workpieces 16 through the chamber 14 can be increased by enhancing the rate at which the target surface 12 is sputtered, preferably by providing a magnetron apparatus 50 to form an electron trapping magnetic field adjacent to the sputtering surface 12 of the target. The electron trapping magnetic field will produce a high flux of electrons traveling parallel to the immediately surface 12 of the target, and thus create a large quantity of ions for bombardment of the target.

The magnetron 50 generally includes a plurality of magnets 52, each of which are connected to a rotating counterbalance plate 54, and each of which includes a north pole and a south pole. The rotating plate 54 is connected to a drive shaft 56 extending through a sealed bearing connection 58. A rotary drive apparatus, such as an electric motor (not shown), is coupled to the drive shaft 56 to provide rotation of the magnets 52. The magnetron 50 provides a plurality of magnetic field lines parallel to the target face, about which electrons are trapped in spiral paths. These electrons collide with argon atoms, thereby ionizing the argon for sputtering. The design and use of magnetrons is described by Mayden in U.S. Pat. No. 4,668,338 which is incorporated herein by reference.

The annular sputtering surface 12 of the target 10 enables deposition of films having uniform thicknesses and conformal deposits in holes or apertures (not shown) that may be formed in the surface of the workpiece 16. Uniformity is provided because a substantial portion of the material deposited at each location on the workpiece is contributed by that portion of the target directly above that location on the workpiece.

Figure 2:
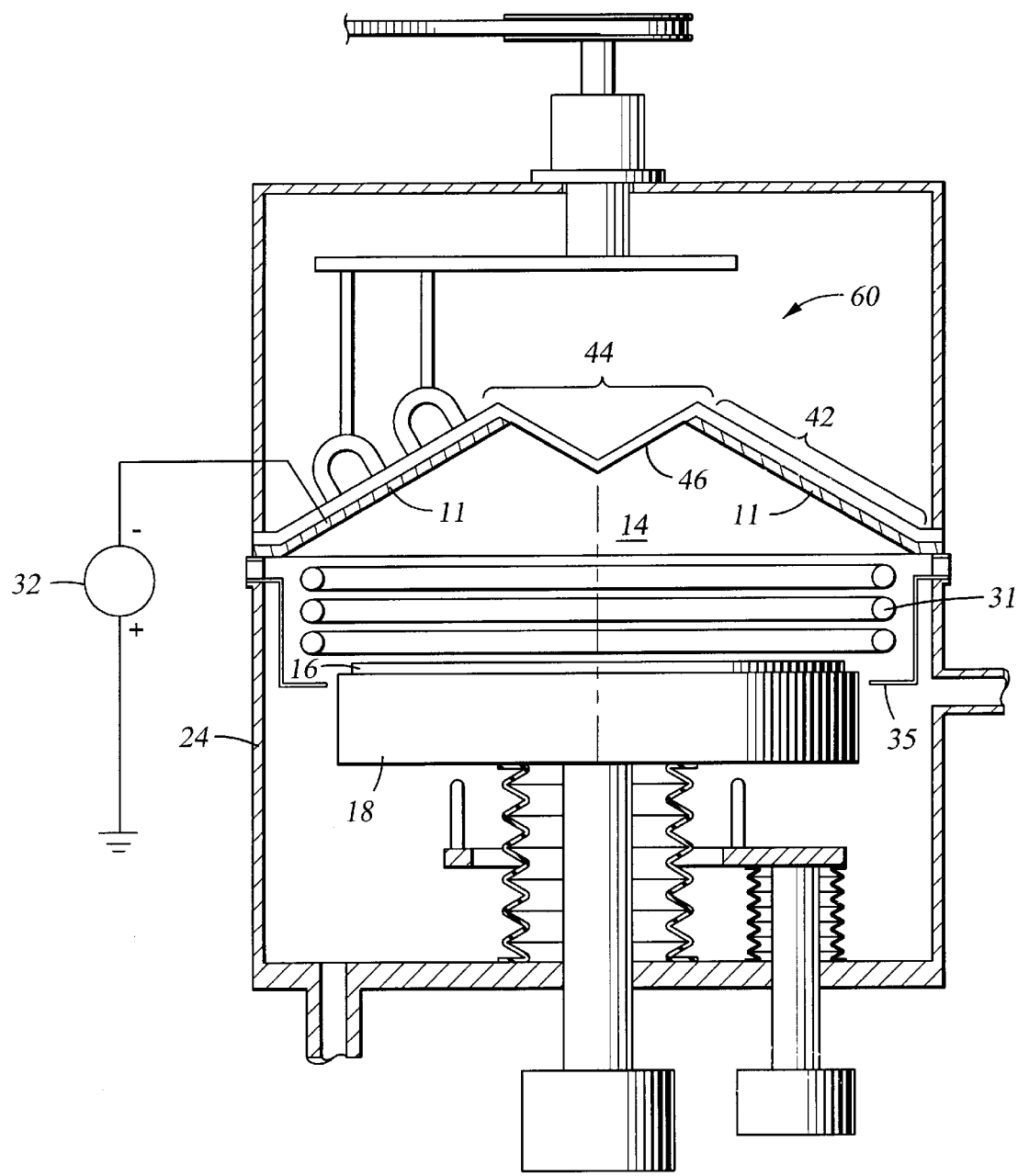
FIG. 2 is a cross-sectional view of a sputtering apparatus having a second target structure in accordance with the present invention.

FIG. 2 is a cross-sectional view of a sputtering apparatus having a second target structure 60 in accordance with the present invention. The structure of the target 60 is similar to that of target 10 in FIG. 1, except that the exposed surfaces 46, 46a disposed in the central region 44 is generally convex. The convex surface 46 may be provided by a variety of shaped members, such as a dome or other curvilinear shape, but is most preferably a frustoconical surface as shown in FIG. 2. The frustoconical surface 46 is extended towards the workpiece 16 to intercept or receive direct deposition, which adheres better than backscatter deposition. Furthermore, the angle at which particles deposit onto the surface 46 of target 60 is greater than with target 10, thereby providing better adhesion and further decreasing the likelihood that the particles will fall off.

Although the preferred target profiles have been described herein in terms of frustoconical profiles, other sputtering surface profiles are specifically contemplated by the invention. For example, the target may be substantially conical or substantially frustoconical with the sputtering surface being bowed slightly. Likewise, the target could have a truncated spherical profile, a bowl shaped profile or even a non-uniform, curvilinear profile selected to provide a uniform deposition layer on the workpiece for a given target material. The target may even have a flat profile and be disposed parallel to, or at an angle with, the substrate.

Figure 3:
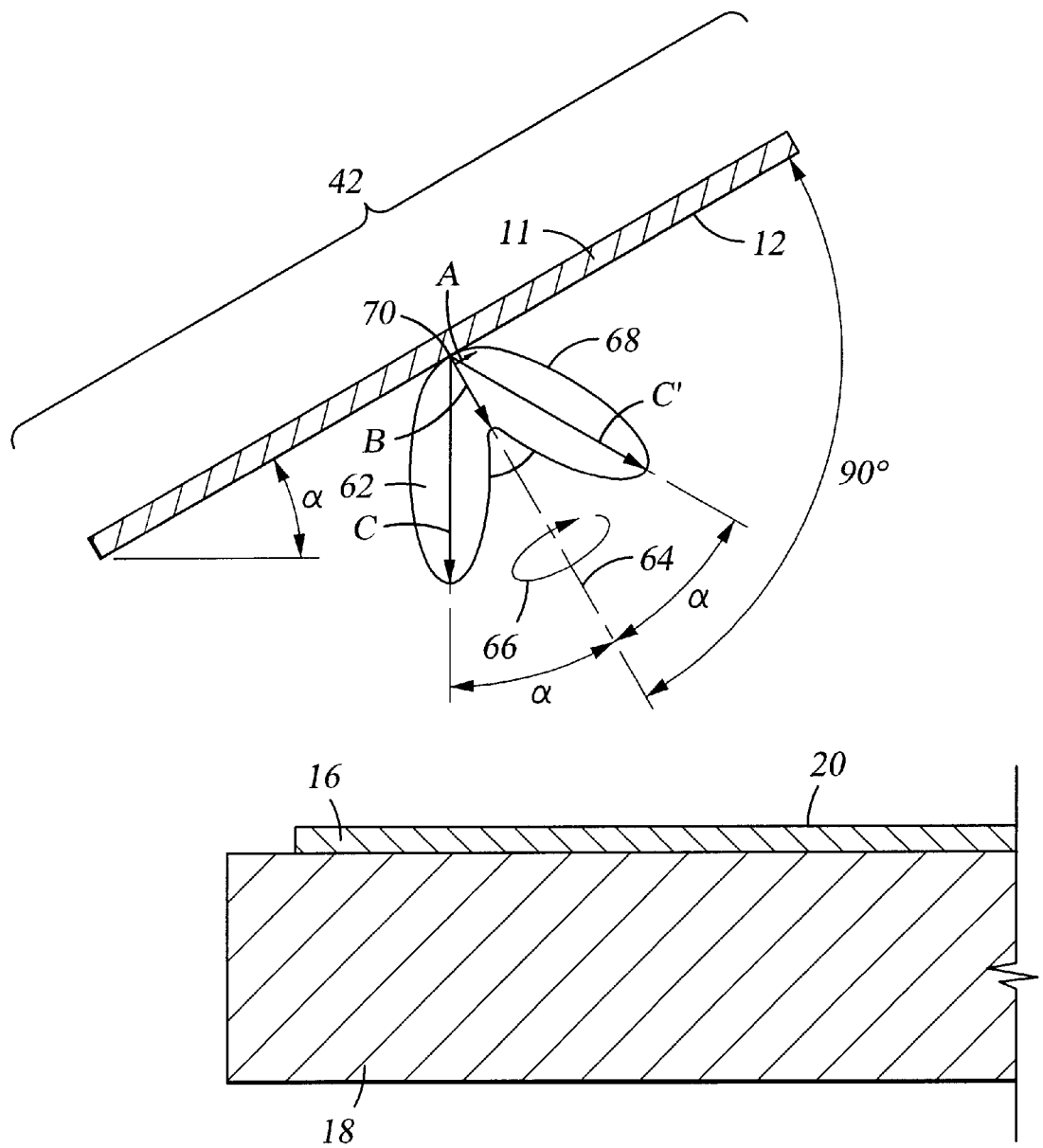
FIG. 3 is a schematic cross-sectional view of a target surface showing the distribution of particles sputtered therefrom.

FIG. 3 is a schematic cross-sectional view of the surface 12 of the target 11 showing the distribution 62 of particles sputtered therefrom. The distribution 62 of trajectories of the target material sputtered from a point 39 of the target 11 is representative of the distribution of trajectories emanating from all points on the target surface 12. The exact distribution 62 shown in FIG. 3 is specific to an aluminum or aluminum alloy target 11, but the same general principles discussed below will apply to targets made from other materials.

The cross-sectional view of the distribution pattern 62 shown in FIG. 3 is only representative of the full distribution pattern, which is defined by rotating the pattern 62 by 180° around the reference line 64 (as indicated by arrow 66). The distribution pattern 62 may be defined by an envelope 68, wherein the probability of a target particle traveling from a point 70 on the sputtering surface 12 of the target 11 with a particular trajectory (such as the trajectories illustrated by vectors A, B, C and C') is proportional to the distance between that point 70 and the location where the trajectory passes through the envelope 68.

As one or more plasma ions bombard the sputtering surface 12 of the target 11, they will free an atom, or a larger particle, of target material from the sputtering surface 12. The particles sputtered from the target tend to travel from the sputtering surface in linear trajectories and deposit on any surface they contact, including the upper surface 20 of the workpiece 16. The trajectories of the particles are predictable for a given target material. For example, an aluminum or aluminum alloy target 11 may sputter particles with trajectories symmetrically distributed over 360° about a reference line 64 extending through the source location 70 and perpendicular to the sputtering surface 12 and at an angle ranging between approximately 0° from the reference line 66 (as shown by Vector B) to an angle as great as 90° (as shown by Vector A). However, most of the aluminum target particles will travel in paths ranging from 25° to 55° from the reference line 66. The 25° to 55° range of sputter particle trajectories is centered around a peak in the distribution which is typically located at approximately 40° from the reference line 6 (as shown by Vector C). The probability that a particle will travel in any trajectory relative to the Vector C is approximately proportional to the cosine of the angle between that trajectory and the Vector C, wherein the target particle may also travel, with equal probability, at that angle from the Vector C anywhere within a 360° are about the reference line 6. Therefore, the distribution of the target material trajectories may be considered conical.

If the sputtering surface of a planar aluminum target is located parallel to the workpiece 16, most of the target material sputtered from the target will be traveling in trajectories which are oblique to the workpiece surface, and will tend to deposit non-uniform or asymmetric film layers on the field or the base and walls of holes (not shown) formed in the uppermost surface 20 of the workpiece 16. The configuration of the targets 10, 60 of the present invention substantially mitigates this phenomenon, by arranging the sputtering surface 12 of the target 11 askew, or oblique, to the uppermost surface 20 of the workpiece 16 (as shown in FIGS. 1 and 2), such that a portion of the non-uniform distribution 62 travels in a trajectory which is substantially perpendicular to the workpiece 16, and the portion of the target material traveling most obliquely from the sputtering surface 12 is directed either to the adjacent side wall 24 of the chamber 14 or to the surface 46 of the central region 44. In the case of an aluminum target having the sputtering trajectory probability distribution 62, the sputtering surface 12 of the target 11 is preferably disposed at an angle α with respect to the planar deposition receiving surface 20 of the workpiece 16, wherein the angle α is equal to the angle between the peak probability in the distribution 62 (as shown by Vector C) and a reference line 64. Therefore, a relatively large quantity of target material traveling in a trajectory perpendicular to the workpiece 16 will be deposited on the workpiece surface 20.

By tilting the surface 12 of the sputtering target 11 with respect to the top-most, deposition receiving surface 20 of the workpiece 16, one of the Vectors C of peak distribution probability may be positioned substantially perpendicular to the surface of the workpiece 16, and the Vector C', representing the peak trajectory of particles most transverse to the upper surface of the target 11, is nearly parallel to the surface of the workpiece 16. Therefore, the tilted surface of the target 11 directs a portion of the otherwise transversely traveling target material flux to the chamber wall, while it simultaneously directs a portion of the otherwise transversely traveling target particle trajectories nearly perpendicular to the workpiece. The enhancement of the perpendicular portion of the target particle trajectories, coincident with the translation of the most transverse trajectories to more transverse trajectories, enables hole filling with reduced overhang and enhanced base and wall coverage.

By extending the tilted surface of the target to form an annular region generally concentric with the workpiece surface 20, all regions of the workpiece 16 receive deposition particles traveling in paths which are nearly perpendicular to the workpiece surface and which also correspond to a path traveling through the peak probability of the distribution. It should be noted that although the invention has been described herein in terms of an aluminum target, the invention may be used in conjunction with other target materials, such as titanium, wherein the peak in the sputtered particle distribution is not perpendicular to the planar surface of the target.

While the foregoing is directed to the preferred embodiment of the present invention, other and further embodiments of the invention may be devised without departing from the basic scope thereof, and the scope thereof is determined by the claims which follow.

What is claimed is:

1. A target for a physical vapor deposition system, comprising:

a backing plate having an annular region and a central region, the central region having a substantially convex exposed collection surface; and a sputterable material disposed on the annular region of the backing plate.

2. The target of claim 1, wherein the sputterable material disposed on the annular region of the backing plate has a sputterable surface that is concave.

3. The target of claim 2, wherein the sputterable material disposed on the annular region of the backing plate has a sputterable surface that is substantially frustoconical.

4. The target of claim 3, wherein the exposed surface of the central region is substantially frustoconical.

5. The target of claim 1, wherein the central region has an exposed surface that is substantially frustoconical.

6. The target of claim 1, wherein the central region of the backing plate comprises a material selected from aluminum and stainless steel.

7. The target of claim 6, wherein the central region is substantially frustoconical.

8. The target of claim 6 wherein the central region is electrically grounded.

9. The target of claim 1, wherein the central region of the backing plate comprises the same material as the annular region.

10. The target of claim 1, wherein the central region comprises a non-sputterable member.

11. The target of claim 10, wherein the non-sputterable member comprises a material selected from aluminum and stainless steel.

12. The target of claim 10, wherein the non-sputterable member is electrically grounded.

13. The target of claim 10, wherein the sputterable material disposed on the annular region of the backing plate has a sputterable surface that is substantially frustoconical.

14. The target of claim 1 wherein the sputterable surface is disposed at an angle between about 25 degrees and about 55 degrees with respect to the support member.

15. A sputter chamber comprising:

an enclosure;

a workpiece support member disposed in the enclosure to form an anode; and a target disposed in the enclosure to form a cathode, the target comprising:
  i) a backing plate having an annular region and a central region, the central region having a substantially convex exposed collection surface; and
  ii) a sputterable material disposed on the annular region of the backing plate.

16. The sputter chamber of claim 15, wherein the backing plate comprises a material selected from aluminum and stainless steel.

17. The sputter chamber of claim 16, further comprising an insulative member for electrically insulating the backing plate from the target.

18. The sputter chamber of claim 15, wherein the central region is substantially frustoconical.

19. The sputter chamber of claim 15, wherein the central region is contoured.

20. The sputter chamber of claim 15, wherein the annular region is concave and substantially frustoconical.

21. The sputter chamber of claim 20, wherein the central region is substantially frustoconical.

22. The sputter chamber of claim 15, wherein the central region comprises a sputterable material.

23. The sputter chamber of claim 22, wherein the central region comprises the same sputterable material as the annular region.

24. The sputter chamber of claim 22 wherein the central region is electrically grounded.

25. The sputter chamber of claim 15, wherein the central region comprises non-sputterable material.

26. The sputter chamber of claim 15 wherein the annular region is substantially concave.

27. The sputter chamber of claim 15, further comprising:
  an inductive coil disposed around the enclosure, the inductive coil coupled to a power supply.

28. The sputter chamber of claim 27, wherein the annular region is concave.

29. The sputter chamber of claim 27, wherein the annular region is substantially frustoconical.

30. The sputter chamber of claim 27, wherein the central region is substantially frustoconical.

31. The sputter chamber of claim 27, wherein the central region comprises a nonsputterable material.

32. The sputter chamber of claim 15 wherein the sputterable surface is disposed at an angle between about 25 degrees and about 55 degrees with respect to the support member.

33. The sputter chamber of claim 15, further comprising a magnet assembly disposed adjacent the annular region of the backing plate.

34. A target for a physical vapor deposition system, comprising:
  a backing plate having a substantially convex central portion; and a frustoconical annular portion surrounding the central portion; and
  a sputterable material disposed on the frustoconical annular portion of the backing plate.

35. The target of claim 34 wherein the central portion has a substantially convex blocking surface.

36. The target of claim 35 wherein the central portion is electrically grounded.

37. The target of claim 35 wherein the sputterable material disposed on the annular portion has a frustoconical surface forming an angle between about 25 degrees and about 55 degrees with respect to a substrate surface.

38. The target of claim 35, further comprising:
  a magnet assembly disposed adjacent the annular portion of the backing plate.

* * * * *